(12) United States Patent
Kobayashi et al.

(10) Patent No.: US 11,387,542 B2
(45) Date of Patent: Jul. 12, 2022

(54) ANTENNA APPARATUS

(71) Applicant: Murata Manufacturing Co., Ltd., Nagaokakyo (JP)

(72) Inventors: Hideaki Kobayashi, Nagaokakyo (JP); Kenichi Ishizuka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 231 days.

(21) Appl. No.: 16/912,746

(22) Filed: Jun. 26, 2020

(65) Prior Publication Data

US 2020/0328496 A1  Oct. 15, 2020

Related U.S. Application Data

(63) Continuation of application No. PCT/JP2019/007730, filed on Feb. 28, 2019.

(30) Foreign Application Priority Data

Mar. 15, 2018 (JP) .............................. JP2018-048018

(51) Int. Cl.
*H04B 1/00* (2006.01)
*H01Q 1/22* (2006.01)
(Continued)

(52) U.S. Cl.
CPC ............ *H01Q 1/2208* (2013.01); *H03H 7/40* (2013.01); *H04B 1/70753* (2013.01)

(58) Field of Classification Search
CPC . H04B 1/00; H04B 1/006; H04B 1/40; H04B 1/70753; H04B 15/00;
(Continued)

(56) References Cited

U.S. PATENT DOCUMENTS 9,270,302 B2 * 2/2016 Khlat ................... H04B 1/0064
9,337,990 B2 * 5/2016 Narahashi ............ H04L 5/1461
(Continued)

FOREIGN PATENT DOCUMENTS

JP    2014-017750 A    1/2014
JP    2017-098632 A    6/2017
(Continued)

OTHER PUBLICATIONS

Balteanu, Linear Front End Module for 4G/5G LTE Advanced Applications, IEEE, 4 pages, Sep. 2018.*
(Continued)

*Primary Examiner* — Frank Duong
(74) *Attorney, Agent, or Firm* — Keating & Bennett, LLP

(57) ABSTRACT

An antenna apparatus includes an antenna element, a switch with a common terminal that is electrically connected to the antenna element side, a first signal path provided between a first input/output terminal of the switch and a first communication circuit, and a second signal path provided between a second input/output terminal of the switch and a second communication circuit. The first signal path includes a radio-frequency circuit and a phase shifter, and the RF circuit has an impedance that is open or shorted in a second frequency band as seen from the antenna element side. In a state in which the first input/output terminal and the second input/output terminal are both electrically connected to the common terminal, the phase shifter provides a phase shift, and the impedance in the second frequency band of the first signal path as seen from the common terminal is open.

10 Claims, 10 Drawing Sheets

(51) Int. Cl.
H03H 7/40 (2006.01)
H04B 1/7075 (2011.01)

(58) Field of Classification Search
CPC ......... H03H 7/0115; H03H 7/09; H03H 7/18;
H03H 7/38; H03H 7/40; H03H 7/46;
H03H 9/54; H03H 9/64; H03H 9/70;
H03H 2250/00; H01Q 1/2208; H01Q
3/36; H01Q 5/50
See application file for complete search history.

(56) References Cited

U.S. PATENT DOCUMENTS

| | | | | |
|---|---|---|---|---|
| 9,660,687 | B2* | 5/2017 | Ellä | H04B 1/40 |
| 9,722,639 | B2* | 8/2017 | Khlat | H04B 1/0064 |
| 9,991,909 | B2* | 6/2018 | Watanabe | H03H 7/0115 |
| 9,998,153 | B2* | 6/2018 | Balm | H04B 1/006 |
| 10,784,903 | B2* | 9/2020 | Wloczysiak | H04L 5/001 |
| 11,206,010 | B2* | 12/2021 | Miyazaki | H04B 1/40 |
| 2014/0203887 | A1* | 7/2014 | Murata | H03H 7/38 |
| | | | | 333/103 |
| 2014/0321312 | A1 | 10/2014 | Narahashi et al. | |
| 2017/0133999 | A1 | 5/2017 | Ishizuka et al. | |
| 2017/0141801 | A1 | 5/2017 | Watanabe | |
| 2017/0222665 | A1* | 8/2017 | Chang | H04L 5/0041 |
| 2018/0019509 | A1* | 1/2018 | Yasuda | H03H 9/725 |
| 2018/0083762 | A1* | 3/2018 | Kogure | H03F 3/245 |
| 2018/0331716 | A1* | 11/2018 | Zhang | H04B 1/00 |
| 2019/0068166 | A1 | 2/2019 | Ishizuka | |

FOREIGN PATENT DOCUMENTS

WO 2016/152603 A1 9/2016
WO 2018/016340 A1 1/2018

OTHER PUBLICATIONS

Official Communication issued in International Patent Application No. PCT/JP2019/007730, dated Apr. 2, 2019.

* cited by examiner

ANTENNA APPARATUS

CROSS REFERENCE TO RELATED APPLICATIONS

This application claims the benefit of priority to Japanese Patent Application No. 2018-048018 filed on Mar. 15, 2018 and is a Continuation Application of PCT Application No. PCT/JP2019/007730 filed on Feb. 28, 2019. The entire contents of each application are hereby incorporated herein by reference.

BACKGROUND OF THE INVENTION

1. Field of the Invention

The present invention relates to an antenna apparatus that, in order to support carrier aggregation, electrically connects both of signal paths in two different frequency bands to an antenna with a switch provided therebetween.

2. Description of the Related Art

Japanese Unexamined Patent Application Publication No. 2017-98632 describes a radio frequency (RF) module for supporting carrier aggregation, which includes a (simultaneously connectable) switch circuit for connecting a common terminal and both or all of a plurality of input/output terminals, and a matching circuit provided in each of signal paths corresponding to different frequency bands.

Switch simultaneous connection for performing carrier aggregation is not limited to that in an RF module as described in Japanese Unexamined Patent Application Publication No. 2017-98632, and the case of connecting RF modules by a switch is also conceivable. In the case of connecting RF modules by a switch, even if a filter circuit is adjusted in each of the modules, the phase shift operation of each signal path may have an adverse effect. In short, if the impedance of an RF module including a signal path, as seen from the common terminal of the switch, is not open but is shorted, signals may flow into that RF module via the common terminal of the switch. In a state where isolation between such RF modules is deteriorated, problems such as signal interference or signal fade occur.

SUMMARY OF THE INVENTION

Preferred embodiments of the present invention provide antenna apparatuses that each significantly reduce or prevent problems, for example, signal interference or signal fade, by significantly reducing or preventing signals from flowing in via a common terminal in a switch simultaneous connection state.

An antenna apparatus according to a preferred embodiment of the present invention includes an antenna element that processes a signal in a first frequency band and a signal in a second frequency band with a frequency band that is different from the first frequency band; a switch including a common terminal that is electrically connected to the antenna element side; a first signal path provided between a first input/output terminal of the switch and a first communication circuit; and a second signal path provided between a second input/output terminal of the switch and a second communication circuit.

The first signal path includes a radio-frequency (RF) circuit and a phase shifter.

The RF circuit has an impedance that is open or shorted in the second frequency band as seen from the antenna element side.

The phase shifter includes a first port electrically connected to the switch side; a second port electrically connected to the RF circuit side; a first coil electrically connected between the first port and ground; a second coil that magnetic-field couples to the first coil with a coupling coefficient of less than 1, and that is electrically connected between the second port and the ground; and a capacitor provided between the first port and the second port.

The phase shifter provides a phase shift, and an impedance in the second frequency band of the first signal path as seen from the common terminal is open in a state of the switch in which the common terminal and the first input/output terminal are electrically connected and the common terminal and the second input/output terminal are electrically connected.

With the above-described features, the impedance in the second frequency band of the first signal path as seen from the common terminal of the switch is open, and signals input to and output from the second input/output terminal via the second signal path are less likely to be affected by the above-described RF circuit on the first signal path.

In a preferred embodiment of the present invention, the capacitor of the phase shifter includes a parasitic capacitance between the first coil and the second coil. With this feature, an external capacitor becomes unnecessary, or a low-capacitance capacitor may be included.

In a preferred embodiment of the present invention, when an area in which a real part of a reflection coefficient is positive and an imaginary part is positive is represented as a first quadrant of a Smith chart, and an area in which the real part of the reflection coefficient is positive and the imaginary part is negative is represented as a fourth quadrant of the Smith chart, in the second frequency band, a round-trip phase change amount between the common terminal and the RF circuit may be a phase change amount in which the reflection coefficient of the first signal path as seen from the common terminal is positioned in the first quadrant or the fourth quadrant of the Smith chart. Accordingly, in the second frequency band, the impedance of the first signal path as seen from the common terminal seems to be high, and signals input to and output from the second input/output terminal of the switch via the second signal path are less likely to be affected by the above-described RF circuit on the first signal path.

In a preferred embodiment of the present invention, in the second frequency band, a round-trip phase change amount between the common terminal and the RF circuit may be a phase change amount in which an impedance of the first signal path as seen from the common terminal is greater than or equal to about 100Ω. Accordingly, in the second frequency band, the impedance of the first signal path as seen from the common terminal seems to be high, and signals input to and output from the second input/output terminal of the switch via the second signal path are less likely to be affected by the above-described RF circuit on the first signal path.

According to preferred embodiments of the present invention, antenna apparatuses that each significantly reduce or prevent problems, for example, signal interference or signal fade by significantly reducing or preventing signals from flowing in via a common terminal of a switch in the switch simultaneous connection state is provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
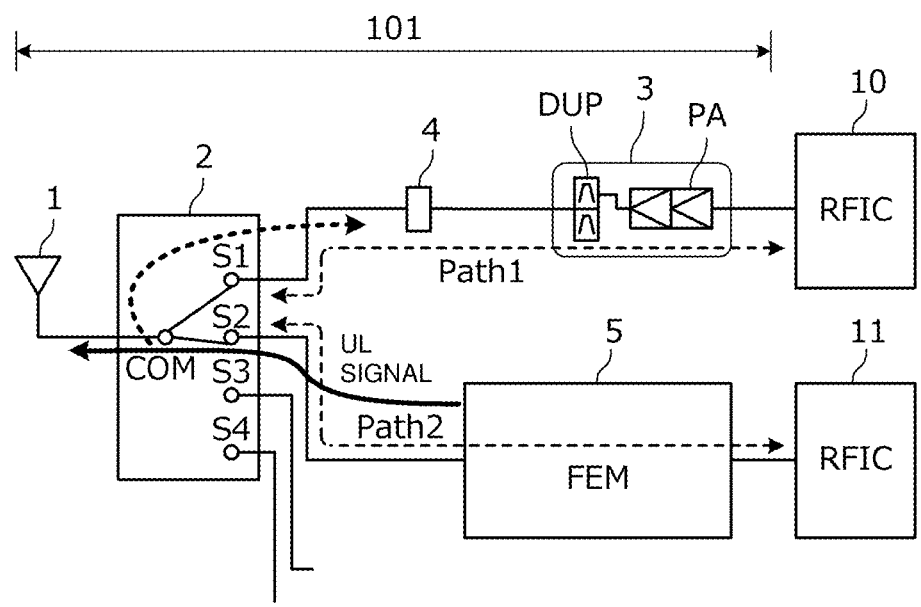
FIG. 1A is a block diagram showing an antenna apparatus 101 according to a preferred embodiment of the present invention.
Figure 1B:
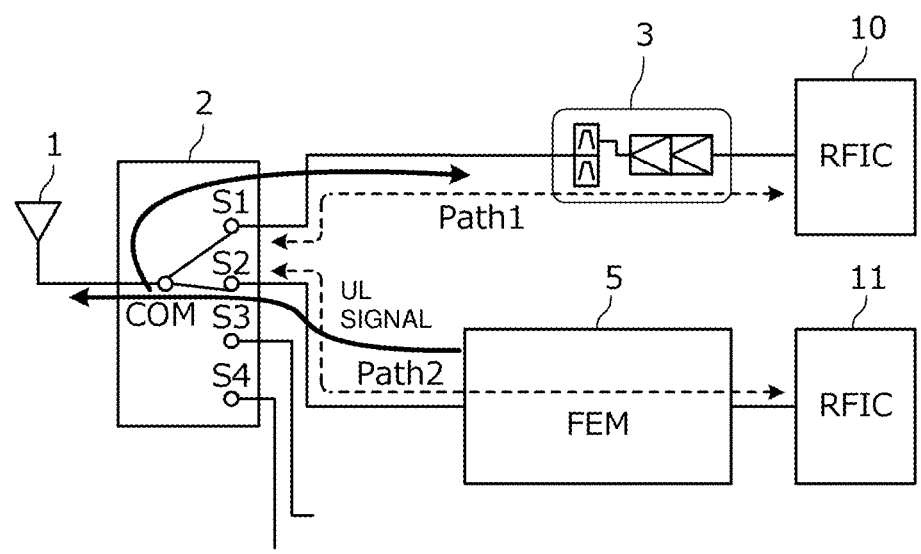
FIG. 1B is a block diagram showing an antenna apparatus of a comparative example.

FIG. 1A is a block diagram showing an antenna apparatus 101 according to a preferred embodiment of the present invention. FIG. 1B is a block diagram showing an antenna apparatus of a comparative example.

The antenna apparatus 101 shown in FIG. 1A includes an antenna element 1, a switch 2, RFICs 10 and 11, a first signal path Path1, and a second signal path Path2. A power amplifier module 3 and a phase shifter 4 are provided on the first signal path Path1. In addition, a front-end module 5 is provided on the second signal path Path2.

The antenna element 1 processes signals in a first frequency band and signals in a second frequency band with a frequency band that is different from the first frequency band. In short, the antenna element 1 transmits or receives signals at least in the first frequency band and the second frequency band. The first frequency band is preferably, for example, a frequency band from about 700 MHz to about 1000 MHz, and the second frequency band is preferably, for example, a frequency band from about 1700 MHz to about 2100 MHz.

The switch 2 includes a common terminal COM and a plurality of input/output terminals S1 to S4, and the common terminal COM is electrically connected to the antenna element 1 side. The switch 2 is an RF switch that is able to electrically connect both or all of a plurality of input/output terminals to the common terminal COM for carrier aggregation.

The first signal path Path1 is between the first input/output terminal S1 of the switch 2 and the RFIC 10. In addition, the second signal path Path2 is between the second input/output S2 of the switch 2 and the RFIC 11.

The power amplifier module 3 includes a power amplifier PA that power-amplifies signals in the first frequency band, a duplexer DUP that divides transmission signals and reception signals, and the like. The phase of the power amplifier module 3 is defined to provide an open or shorted impedance in the second frequency band as seen from the antenna element 1 side (not from the input/output section on the RFIC 10 side of the power amplifier module 3, but from the input/output section on the antenna element 1 side). The power amplifier module 3 is an example of an "RF circuit". Here, the term "open" is a state where the impedance is higher than about 50Ω. Preferably, the "open" state is a state where the impedance is greater than or equal to about 75Ω, for example. More preferably, the term "open" state is a state where the impedance is greater than or equal to about 100Ω, for example. In addition, the term "shorted" is a state where the impedance is less than or equal to about 20Ω.

Figure 12A:
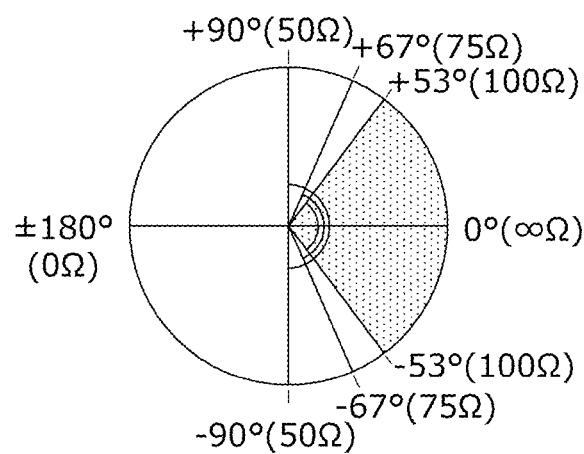
FIGS. 12A and 12B are diagrams representing, on the Smith chart, the range of the phase angle of a reflected signal, and the relationship between this phase angle and an impedance of the power amplifier module 3 as seen from an antenna element 1.
Figure 12B:
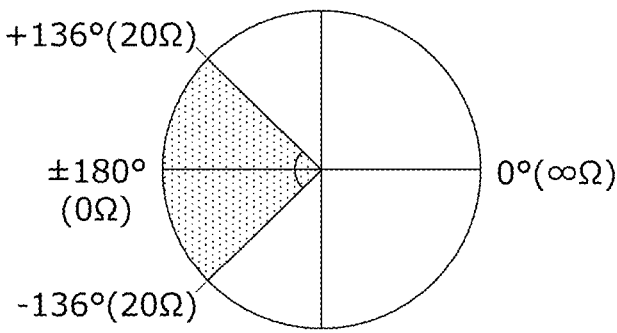

Here, the "open" and "shorted" states are shown in FIGS. 12A and 12B. FIGS. 12A and 12B are diagrams representing, on the Smith chart, the range of the phase angle of a reflected signal, and the relationship between this phase angle and the impedance described above. In FIGS. 12A and 12B, the value of the angle is the angle at each reactance (the imaginary part of the impedance) when the resistance (the real part of the impedance) is 0.

As described above, the state in which the impedance as seen from the input/output section on the antenna element 1 side is "open" refers to a state in which the impedance is higher than about 50Ω (the phase angle of a reflected signal is within the range of about ±90°), preferably a state in which the impedance is higher than about 75Ω (the phase angle of a reflected signal is within the range of about ±53°), and more preferably a state in which the impedance is higher than about 100Ω (the phase angle of a reflected signal is within the range of about ±53°), for example. In addition, the state in which the impedance as seen from the input/output section on the antenna element 1 side is "shorted" refers to a state in which the impedance is less than about 20Ω (the phase angle of a reflected signal is within the range of about +136° to about +180° or the range of about −136° to about −180°).

The front-end module (FEM) 5 includes a filter for transmission signals and reception signals in the second frequency band, and the like. The phase of the front-end module 5 is defined to provide an open impedance in the first frequency band as seen from the antenna element 1 side.

The RFICs 10 and 11 are circuits that perform signal processing of communication signals in the first frequency band and communication signals in the second frequency band, respectively. The RFICs 10 and 11 are one example of a "first communication circuit" and a "second communication circuit", respectively. Note that a first communication circuit that performs signal processing of communication signals in the first frequency band and a second communication circuit that performs signal processing of communication signals in the second frequency band may be defined by a single communication circuit.

The phase shift amount of the phase shifter 4 is defined to provide an open impedance of the first signal path Path1 as seen from the common terminal COM of the switch 2. In the case where the impedance in the second frequency band of the power amplifier module 3 as seen from the antenna element 1 side is shorted, signals in the second frequency band are entirely reflected at the power amplifier module 3. Accordingly, the phase shift amount of the phase shifter 4 is defined to provide a round-trip phase change amount between the common terminal COM and the power amplifier module 3 of about 180 degrees.

The antenna apparatus as a comparative example, shown in FIG. 1B, is the antenna apparatus 101 shown in FIG. 1A including no phase shifter 4. The phase is defined to provide an open impedance in the second frequency band of the power amplifier module 3 shown in FIG. 1B as seen from the antenna element 1 side. However, a signal propagation delay occurs on a signal propagation path between the common terminal COM of the switch 2 and the power amplifier module 3, and as a result, a phase delay occurs. Therefore, the impedance in the second frequency band of the first signal path Path1 as seen from the common terminal COM of the switch 2 becomes not open. Accordingly, in FIG. 1B, if an uplink signal (UL signal) is output from the front-end module 5, the uplink signal (UL signal) flows from the common terminal COM into the first signal path Path1. As a result, power radiated from the antenna element 1 decreases. In addition, the RF power that flows in may break the power amplifier module 3.

In contrast, according to the antenna apparatus 101 of the present preferred embodiment shown in FIG. 1A, because the impedance of the first signal path Path1 as seen from the common terminal COM of the switch 2 is open, power of the uplink signal (UL signal) flowing from the common terminal COM of the switch 2 into the first signal path Path1 is significantly reduced or prevented.

Figure 2:
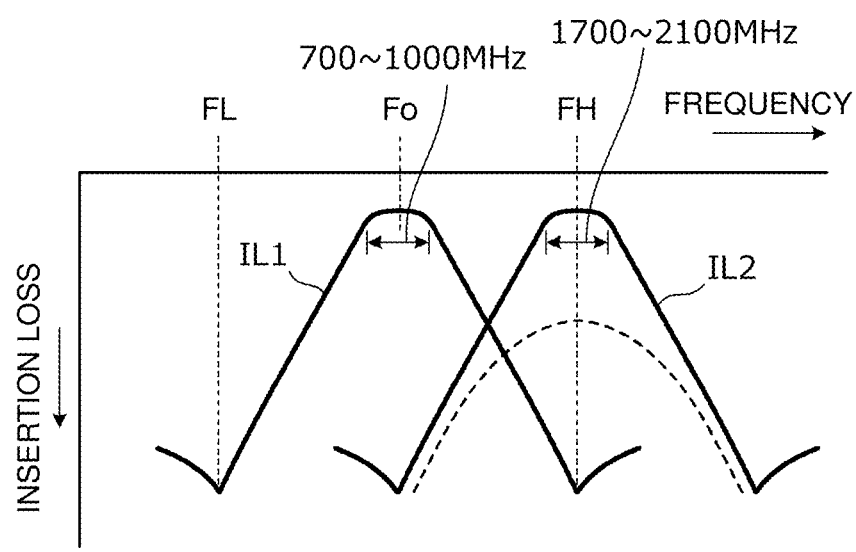
FIG. 2 is a diagram showing the frequency characteristics (IL1) of an insertion loss of a power amplifier module 3 on a first signal path Path1 and the frequency characteristics (IL2) of an insertion loss of a front-end module 5 on a second signal path Path2.

FIG. 2 is a diagram showing the frequency characteristics (IL1) of an insertion loss of the power amplifier module 3 on the first signal path Path1 and the frequency characteristics (IL2) of an insertion loss of the front-end module 5 on the second signal path Path2. In FIG. 2, the center frequency of the pass frequency band of the first frequency band (about 700 MHz to about 1000 MHz, for example) is represented by Fo, a frequency lower than the pass frequency band is represented by FL, and a frequency higher than the pass frequency band is represented by FH.

Figure 3A:
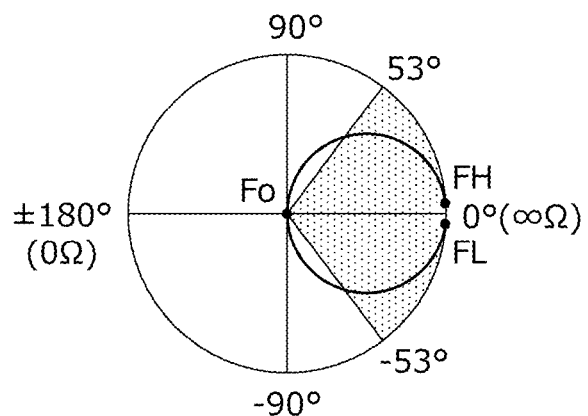
FIGS. 3A to 3C are diagrams showing the operation of a phase shifter 4.
Figure 3B:
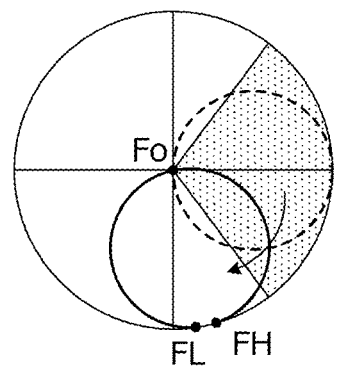
Figure 3C:
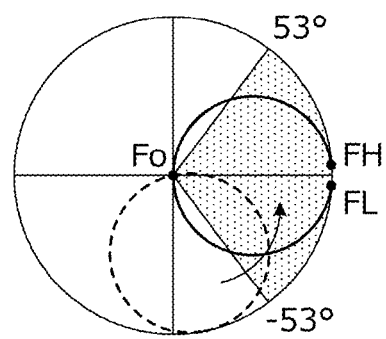

FIGS. 3A to 3C are diagrams showing the operation of the phase shifter 4. FL, Fo, and FH in FIGS. 3A to 3C respectively correspond to FL, Fo, and FH shown in FIG. 2.

FIG. 3A is a diagram representing the impedance of the power amplifier module 3 as seen from the antenna element 1 side as a locus on the Smith chart. In this example, matching is provided with the normalized impedance (about 50Ω, for example) in the first frequency band (pass frequency band). The impedance is open (high impedance) at frequencies lower than the pass frequency band or frequencies higher than the pass frequency band. In FIG. 3A, a fan-shaped range indicated by a dot pattern shows the range of about 53° to about −53°, which is the angle range in which the impedance is regarded as high impedance. This range is the range of about 100Ω or greater in terms of impedance. In other words, even if the phase is rotated within the range of about ±53° from the open state, the impedance is in a high impedance state, and therefore, the impedance may be regarded as substantially "open".

FIG. 3B is a diagram representing the impedance of the first signal path Path1 as seen from the common terminal COM of the switch 2 in FIG. 1B as a locus on the Smith chart. As described above, a signal propagation delay occurs on a signal propagation path between the common terminal COM of the switch 2 and the power amplifier module 3, and as a result, a phase delay occurs.

FIG. 3C is a diagram representing the impedance of the first signal path Path1 as seen from the common terminal COM of the switch 2 in FIG. 1A as a locus on the Smith chart. As described above, the phase shifter 4 provides a phase shift, and the impedance of the first signal path Path1 as seen from the common terminal COM of the switch 2 is open. As a result, the impedance in the second frequency band of the first signal path Path1 as seen from the common terminal COM of the switch 2 becomes open (high impedance).

Under this condition, the round-trip phase change amount between the common terminal COM and the power amplifier module 3 (with the phase shifter 4 provided therebetween) is about 360 degrees (about 0 degrees). Note that this phase change amount is not limited to about 360 degrees, and may be about 360±90 degrees (greater than or equal to about 270 degrees and less than or equal to about 450 degrees). In short, this phase shift amount is the phase change amount in which the impedance in the second frequency band of the first signal path Path1 as seen from the common terminal COM of the switch 2 is higher than about 50Ω. Preferably, this phase change amount is the phase change amount in which the impedance is about 75Ω or greater, for example. More preferably, this phase change amount is the phase change amount in which the impedance is about 100Ω or greater, for example. In FIG. 3C, the impedance in the second frequency band of the first signal path Path1 as seen from the common terminal COM of the switch 2 is within the range of about 100Ω or greater. In short, the impedance is in a state where the impedance may be regarded as open (high impedance).

Figure 4A:
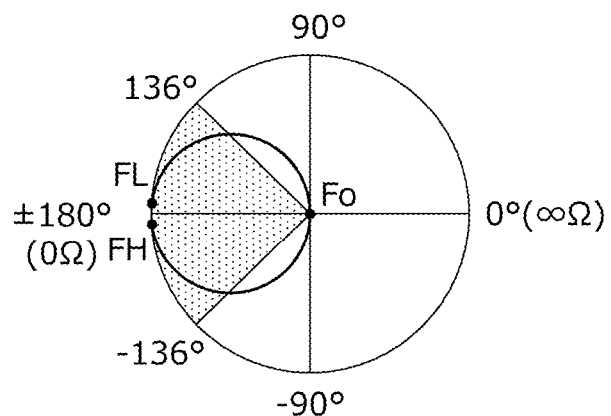
FIGS. 4A to 4C are other diagrams showing the operation of the phase shifter 4.
Figure 4B:
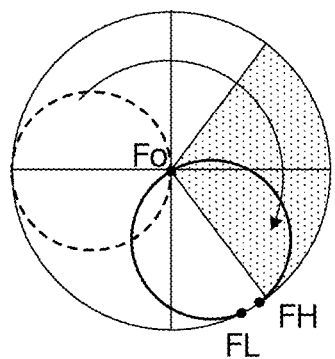
Figure 4C:
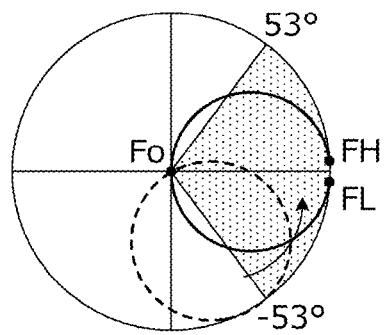

FIGS. 4A to 4C are other diagrams showing the operation of the phase shifter 4. FL, Fo, and FH in FIGS. 4A to 4C respectively correspond to FL, Fo, and FH shown in FIG. 2.

FIG. 4A is a diagram representing the impedance of the power amplifier module 3 as seen from the antenna element 1 side as locus on the Smith chart. In this example, matching is provided with the normalized impedance (about 50Ω, for example) in the first frequency band (pass frequency band). The impedance is shorted (low impedance) at frequencies lower than the first frequency band or frequencies higher than the pass frequency band. In FIG. 4A, a fan-shaped range indicated by a dot pattern shows the range of about 136° to about −136°, which is the angle range in which the impedance is regarded as low impedance. This range is the range of about 20Ω or less in terms of impedance. In other words, even if the phase is rotated within the range of about ±44° (180°-136°=44°) from the shorted state, the impedance is in a low impedance state, and therefore, the impedance may be regarded as substantially "shorted".

FIG. 4B is a diagram representing the impedance of the first signal path Path1 as seen from the common terminal COM of the switch 2 in FIG. 1B as a locus on the Smith chart. As described above, a signal propagation delay occurs on a signal propagation path between the common terminal COM of the switch 2 and the power amplifier module 3, and as a result, a phase delay occurs. In this example, the phase delay amount is greater than that in the example shown in FIG. 3B.

FIG. 4C is a diagram representing the impedance of the first signal path Path1 as seen from the common terminal COM of the switch 2 in FIG. 1A as a locus on the Smith chart. As described above, the phase shifter 4 provides a phase shift, and the impedance of the first signal path Path1 as seen from the common terminal COM of the switch 2 is open. As a result, the impedance in the second frequency band of the first signal path Path1 as seen from the common terminal COM of the switch 2 becomes open.

Under this condition, the round-trip phase change amount between the common terminal COM and the power amplifier module 3 (with the phase shifter 4 provided therebetween) is about 180 degrees. Note that this phase change amount is not limited to about 180 degrees, and may be about 180±90 degrees (greater than or equal to about 90 degrees and less than or equal to about 270 degrees). In short, this phase shift amount is the phase change amount in which the impedance in the second frequency band of the first signal path Path1 as seen from the common terminal COM of the switch 2 is higher than about 50Ω. Preferably, this phase change amount is the phase change amount in which the impedance is about 75Ω or greater, for example. More preferably, this phase change amount is the phase change amount in which the impedance is about 100Ω or greater, for example. In FIG. 4C, the impedance in the second frequency band of the first signal path Path1 as seen from the common terminal COM of the switch 2 is within the range of about 100Ω or greater. In short, the impedance is in a state where the impedance may be regarded as open (high impedance).

Figure 5:
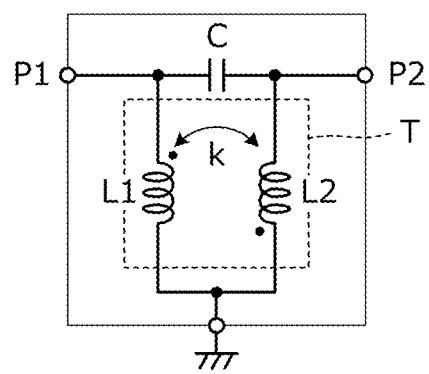
FIG. 5 is a circuit diagram of the phase shifter 4.
Figure 6:
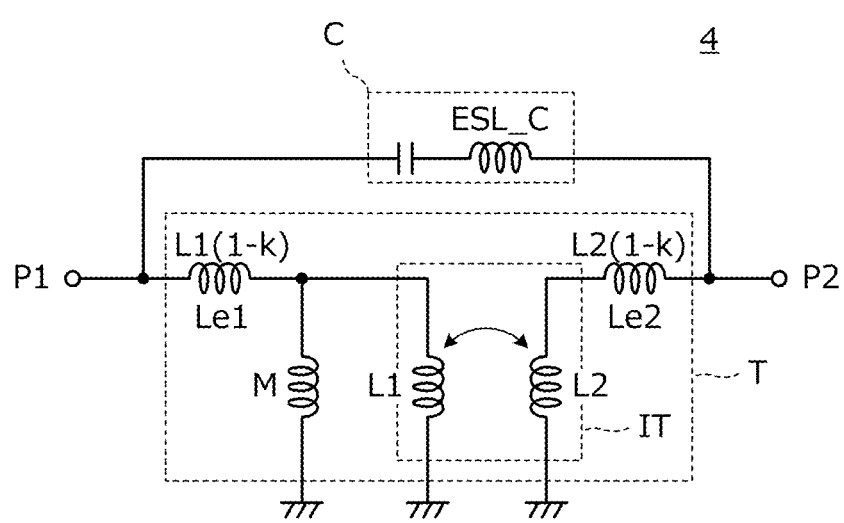
FIG. 6 is an equivalent circuit diagram of the phase shifter 4, which separately represents a transformer portion into an ideal transformer and a capacitance inductance component.

FIG. 5 is a circuit diagram of the phase shifter 4. FIG. 6 is an equivalent circuit diagram of the phase shifter 4, which separately represents a transformer portion into an ideal transformer and capacitance inductance components.

As shown in FIG. 5, the phase shifter 4 includes a first coil L1, a second coil L2, and a capacitor C. The first coil L1 is electrically connected between a first port P1 and ground, and the second coil L2 is electrically connected between a second port P2 and ground. The first coil L1 and the second coil L2 define a transformer T. The capacitor C is provided between the first port P1 and the second port P2. Accordingly, with the capacitor C between the first port P1 and the second port P2, the phase shift amount between the first port P1 and the second port P2 is reduced to be less than about 180 degrees. Without the capacitor C, ideally the phase shift amount due to the transformer T is about 180 degrees. With the capacitor C, the phase shift amount of the phase shifter 4 is advanced to be closer to a phase of about 90 degrees. In short, because a current path going through the capacitor C is generated, the phase shift amount between the first port P1 and the second port P2 of the phase shifter 4 is reduced to be less than about 180 degrees. In accordance with the setting of the capacitance of the capacitor C, the phase shift amount of the phase shifter 4 is defined to a certain value. Actually, the coupling coefficient k of the first coil L1 and the second coil L2 is less than 1, and the phase shift amount due to the transformer T is greater than or equal to about 90 degrees and less than or equal to about 180 degrees. Even if the phase is within this range, the capacitor C brings the phase shift amount of the phase shifter 4 closer to about 90 degrees or a certain phase shift amount.

As shown in FIG. 6, when the transformer T including the first coil L1 and the second coil L2 and with coupling a coefficient that is less than 1 is represented by an equivalent circuit diagram including an ideal transformer IT with a coupling coefficient of 1, the transformer T is represented by the ideal transformer IT, a primary leakage inductance Le1, a secondary leakage inductance Le2, and a magnetizing inductance M. The inductance of the primary leakage inductance Le1 corresponds to L1(1-k), the inductance of the secondary leakage inductance Le2 corresponds to L2(1-k), and the inductance of the magnetizing inductance M corresponds to kL1.

Although the impedance of the phase shifter 4 deviates from a specified value (for example, about 50Ω) due to the parasitic inductance components (Le1, Le2, and M) of the transformer T, the impedance of the phase shifter 4 is adjusted to the specified value by providing the capacitor C shown in FIG. 5. In particular, the capacitor C acts to correct the impedance deviation due to the magnetizing inductance M, which is a parallel parasitic inductance component, and the capacitor C acts to correct the impedance deviation due to the leakage inductances Le1 and Le2, which are series parasitic inductance components.

In FIG. 6, an inductor ESL_C is the equivalent series inductance of the capacitor C. Due to the equivalent series inductance of the capacitor C, the frequency characteristics of the phase shift amount change.

Figure 7:
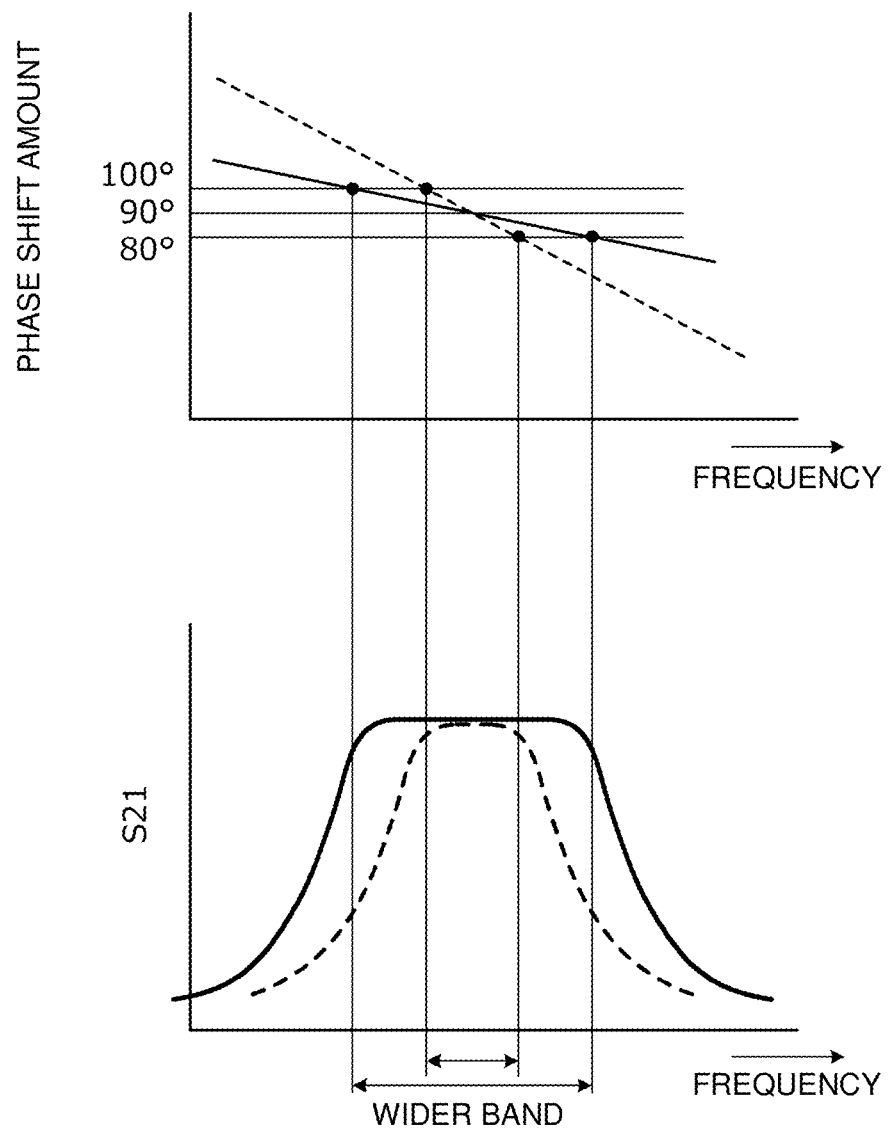
FIG. 7 is a diagram showing the frequency characteristics of the phase shift amount in the phase shifter 4, and the frequency characteristics of the phase shift amount of a phase shifter with an LC filter circuit.

FIG. 7 is a diagram showing the frequency characteristics of the phase shift amount in the phase shifter 4, and the frequency characteristics of the phase shift amount of a phase shifter with an LC filter circuit. The "phase shift amount" in FIG. 7 is the phase change amount of an output signal from the phase shifter 4, with respect to an input signal to the phase shifter 4. In FIG. 7, a solid line is the characteristics of the phase shifter 4, and a broken line is the characteristics of the phase shifter with the LC filter circuit. Here, the LC filter includes a capacitor electrically connected in series with a transmission line, and an inductor electrically connected in shunt between the transmission line and ground. In the phase shifter with the LC filter circuit, the capacitor and the inductor, which are elements, are reactance elements that store energy. Accordingly, the passband of the phase shifter with the LC filter circuit is narrow since an energy loss suddenly increases at frequencies away from the pass frequency band.

As represented in FIG. 7, the phase shift amount is designed to be about 90 degrees at the center frequency of the passband. Compared with the phase shifter with the LC filter circuit, the transformer-type phase shifter 4 has a small change in the phase shift amount with respect to a change in frequency. Accordingly, the phase shift amount is maintained at about 90 degrees over a wide frequency band.

Because the inductance of the leakage inductances Le1 and Le2 is the equivalent series inductance of the transformer T, the smaller the leakage inductances Le1 and Le2, the smaller the tilt of change in the phase shift amount with respect to a change in frequency. Similarly, the smaller the equivalent series inductance ESL_C of the capacitor C, the smaller the tilt of change in the phase shift amount with respect to a change in frequency. Therefore, to reduce the tilt of change in the phase shift amount with respect to a change in frequency shown in FIG. 7 (to provide a more moderate tilt), it is important to reduce the inductance of the leakage inductances Le1 and Le2 and to reduce the equivalent series inductance ESL_C of the capacitor C by increasing the coupling coefficient k of the first coil L1 and the second coil L2.

Figure 8:
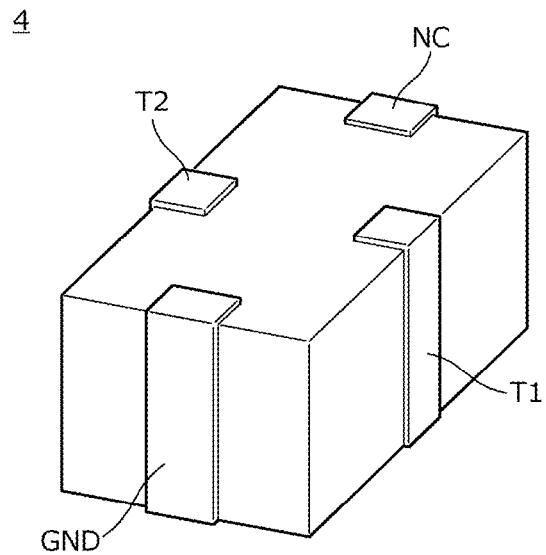
FIG. 8 is an external perspective view of the phase shifter 4.
Figure 9:
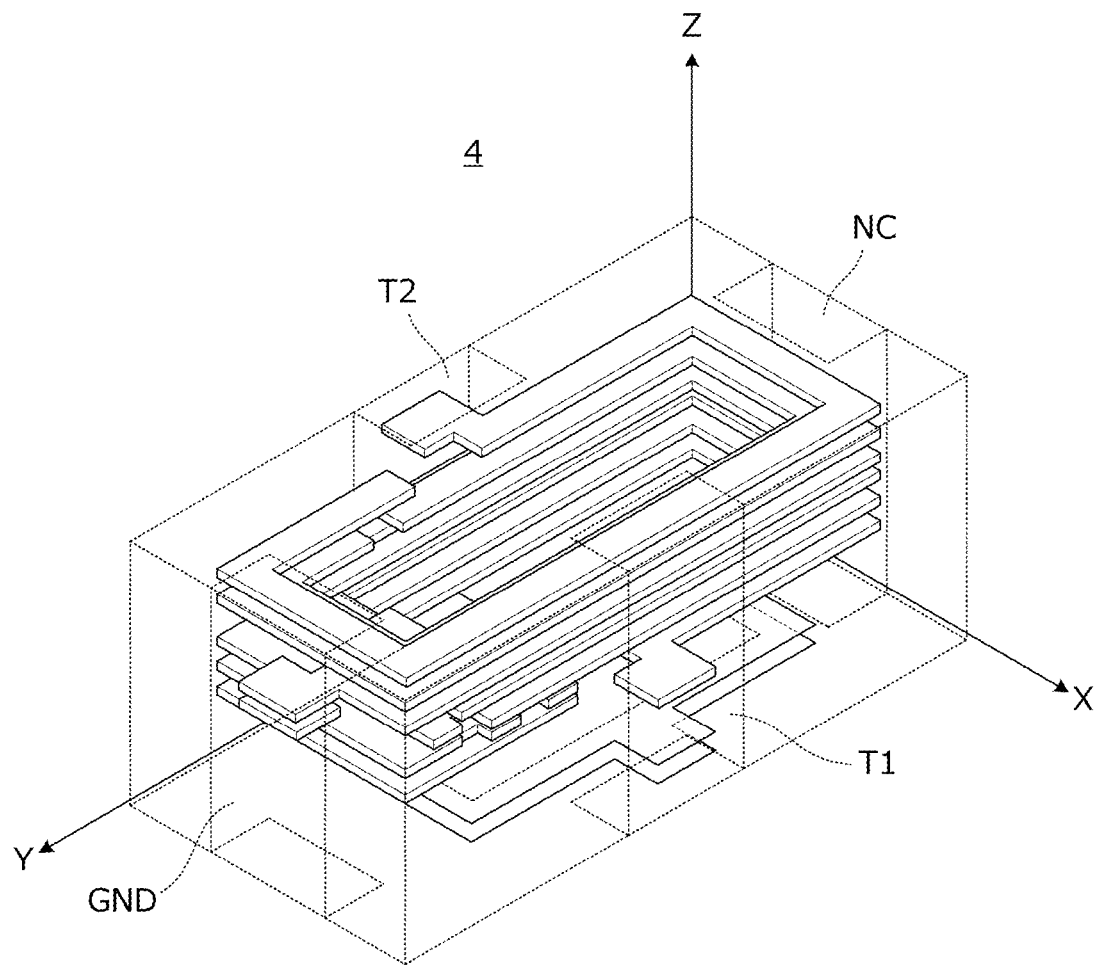
FIG. 9 is a perspective view showing the structure of the interior of the phase shifter 4.

FIG. 8 is an external perspective view of the phase shifter 4. FIG. 9 is a perspective view showing the structure of the interior of the phase shifter 4. On the outer surface of the phase shifter 4, an input/output terminal T1 corresponding to the first port P1, an input/output terminal T2 corresponding to the second port P2, a ground terminal GND, and an empty terminal NC are provided.

Figure 10A:
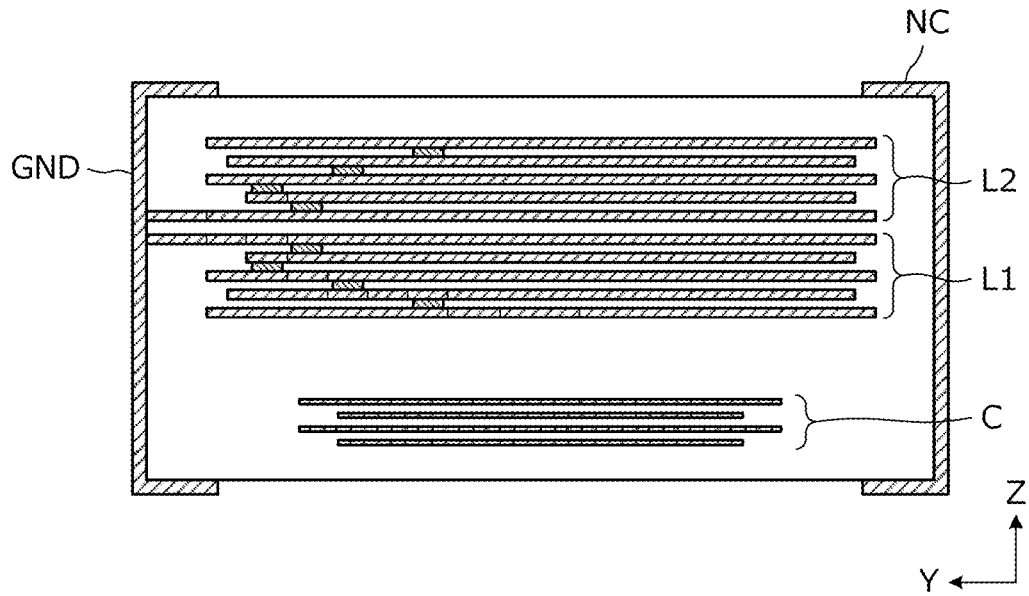
FIG. 10A is a cross-sectional view taken along the Y-Z plane passing through the center of the phase shifter 4 in FIG. 9.
Figure 10B:
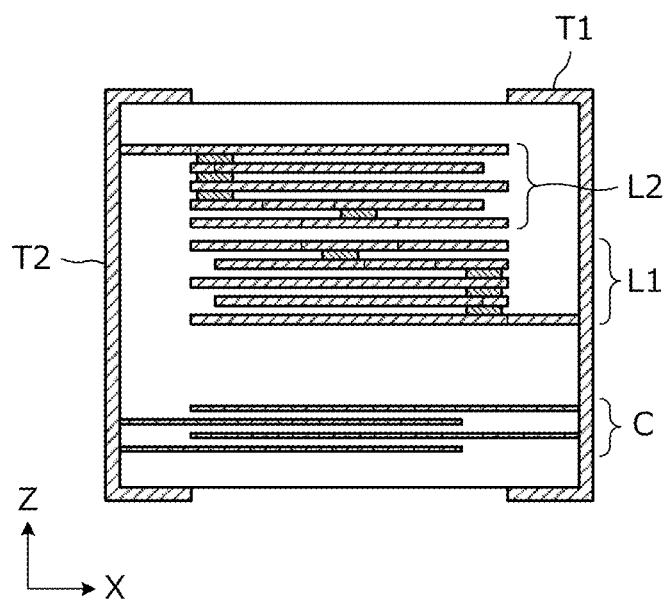
FIG. 10B is a cross-sectional view taken along the X-Z plane passing through the center of the phase shifter 4 in FIG. 9.

FIG. 10A is a cross-sectional view taken along the Y-Z plane passing through the center of the phase shifter 4 in FIG. 9. FIG. 10B is a cross-sectional view taken along the X-Z plane passing through the center of the phase shifter 4 in FIG. 9.

A main portion of the phase shifter 4 is a multilayer body including a plurality of insulating base materials, where conductor patterns are provided on certain insulating base materials. The first coil L1, the second coil L2, and the capacitor C are provided by conductor patters formed on the plurality of insulating base materials.

Figure 11:
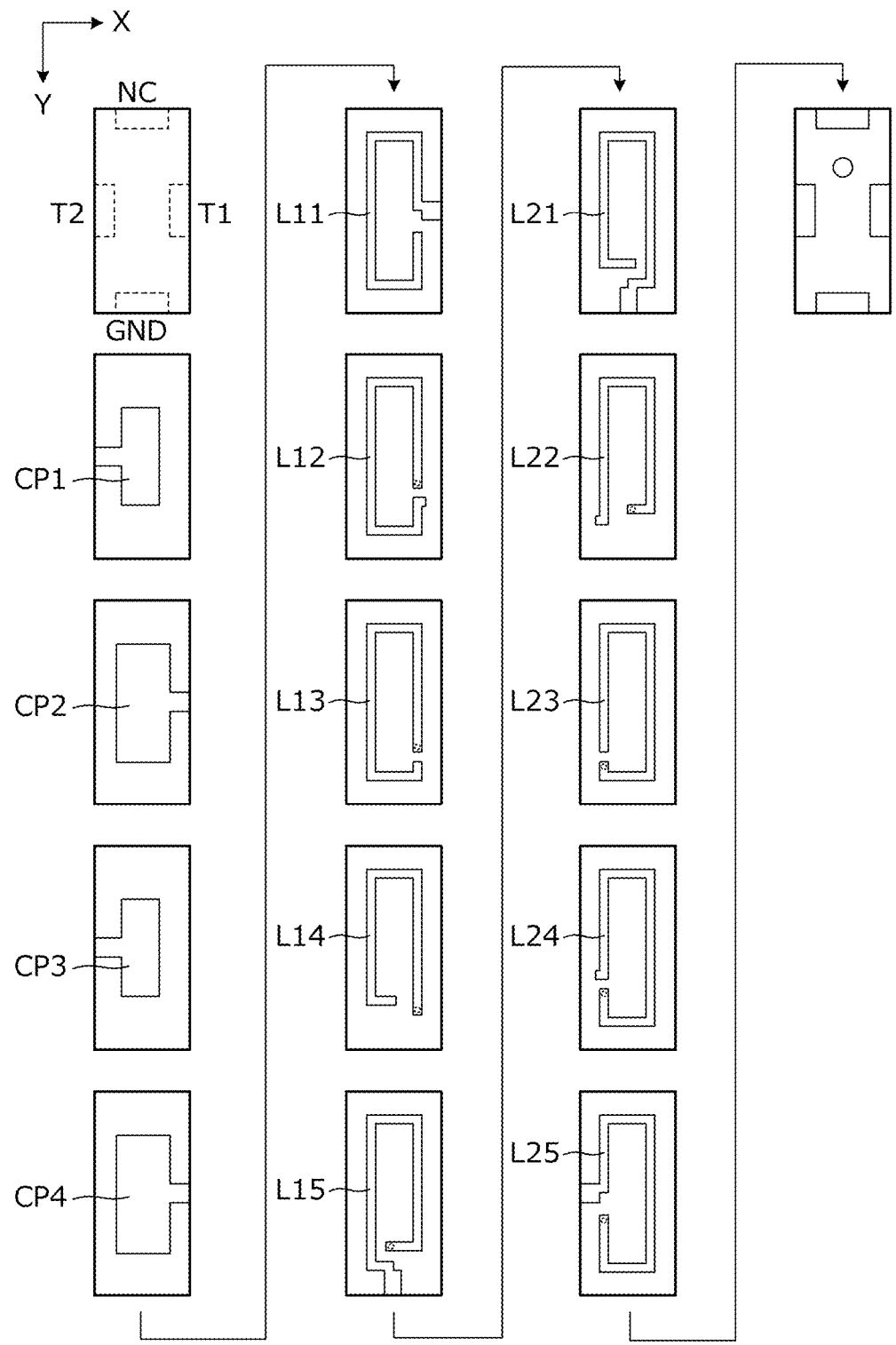
FIG. 11 is a plan view showing conductor patterns formed respectively on a plurality of insulating base materials.

FIG. 11 is a plan view showing conductor patterns provided respectively on the plurality of insulating base materials. Conductor patterns CP1, CP2, CP3, and CP4 that define the capacitor C are provided on four layers above the bottom layer. Conductor patterns L11, L12, L13, L14, and L15 that define the first coil L1 are provided on five layers above that. Conductor patterns L21, L22, L23, L24, and L25 that define the second coil L2 are provided on five layers further above that.

In the phase shifter 4 of the present preferred embodiment, the coupling coefficient k of the first coil L1 and the second coil L2 is increased by bringing layers of the first coil L1 and the second coil L2 adjacent to or in a vicinity of each other. By providing the input/output terminals T1 and T2 respectively on the long sides of the multilayer body facing each other, the inter-terminal distance between the input/output terminals T1 and T2 is shortened, thus reducing the equivalent-series inductance ESL_C of the capacitor C, compared with the case of providing the input/output terminals T1 and T2 respectively on the short sides of the multilayer body facing each other.

The structure of the phase shifter 4 is not limited to that in the above-described preferred embodiment. For example, a parasitic capacitance component generated by providing the first coil L1 and the second coil L2 to face each other may provide the capacitance component of the capacitor C. In short, the capacitor C may be provided by a parasitic capacitance component generated between the first coil L1 and the second coil L2, or may be provided by a composite capacitance of this parasitic capacitance component and the capacitance of another capacitor.

Finally, the description of the above-described preferred embodiment is illustrative in all respects and is not restrictive. Modifications and changes may be appropriately implemented by those skilled in the art.

For example, although the common terminal COM of the switch 2 is directly connected to the antenna element 1 in the example shown in FIG. 1A, another or other circuit elements may be provided between the common terminal COM of the switch 2 and the antenna element 1.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An antenna apparatus comprising:
    an antenna element that processes a signal in a first frequency band and a signal in a second frequency band with a frequency band that is different from the first frequency band;
    a switch including a common terminal that is electrically connected to the antenna element side;
    a first signal path provided between a first input/output terminal of the switch and a first communication circuit; and
    a second signal path provided between a second input/output terminal of the switch and a second communication circuit; wherein
    the first signal path includes a radio-frequency (RF) circuit and a phase shifter;
    the RF circuit has an impedance that is open or shorted in the second frequency band as seen from the antenna element side;
    the phase shifter includes:
        a first port electrically connected to the switch side;
        a second port electrically connected to the RF circuit side;
        a first coil electrically connected between the first port and ground;
        a second coil that magnetic-field couples to the first coil with a coupling coefficient of less than 1, and that is electrically connected between the second port and the ground; and
        a capacitor provided between the first port and the second port; and
    the phase shifter provides a phase shift, and an impedance in the second frequency band of the first signal path as seen from the common terminal is open in a state of the switch in which the common terminal and the first input/output terminal are electrically connected and the common terminal and the second input/output terminal are electrically connected.

2. The antenna apparatus according to claim 1, wherein the capacitor of the phase shifter includes a parasitic capacitance between the first coil and the second coil.

3. The antenna apparatus according to claim 1, wherein
    when an area in which a real part of a reflection coefficient is positive and an imaginary part is positive is represented as a first quadrant of a Smith chart, and an area in which the real part of the reflection coefficient is positive and the imaginary part is negative is represented as a fourth quadrant of the Smith chart; and
    in the second frequency band, a round-trip phase change amount between the common terminal and the RF circuit is a phase change amount in which the reflection coefficient of the first signal path as seen from the common terminal is positioned in the first quadrant or the fourth quadrant of the Smith chart.

4. The antenna apparatus according to claim 1, wherein, in the second frequency band, a round-trip phase change amount between the common terminal and the RF circuit is a phase change amount in which an impedance of the first signal path as seen from the common terminal is greater than or equal to about 100 Ω.

5. The antenna apparatus according to claim 1, wherein the second frequency band is higher than the first frequency band.

6. The antenna apparatus according to claim 1, wherein the RF circuit includes a power amplifier that power-amplifies signals in the first frequency band.

7. The antenna apparatus according to claim 1, wherein the impedance of the RF circuit when the RF circuit is shorted in the second frequency band is less than or equal to about 20 Ω.

8. The antenna apparatus according to claim 1, further comprising a front-end module that filters signals in the second frequency band and provides an open impedance in the first frequency band as seen from the antenna element side.

9. The antenna apparatus according to claim 1, wherein a round-trip phase change amount between the common terminal and the RF circuit is about 360 degrees or about 360±90 degrees.

10. The antenna apparatus according to claim 1, wherein the first coil and the second coil define a transformer; and
a phase shift amount due to the transformer is greater than or equal to about 90 degrees and less than or equal to about 180 degrees.

\* \* \* \* \*